United States Patent [19]
Hanning et al.

[11] Patent Number: 6,027,380
[45] Date of Patent: Feb. 22, 2000

[54] LOCKING MEANS FOR ELECTRONIC MODULES

[75] Inventors: Walter Hanning, Detmold; Joerg Richts, Schlangen; Manfred Wilmes, Detmold, all of Germany

[73] Assignee: Weidmueller Interface GmbH & Co.

[21] Appl. No.: 09/265,419

[22] Filed: Mar. 10, 1999

[30] Foreign Application Priority Data

Mar. 11, 1998 [DE] Germany .......................... 298 04 284

[51] Int. Cl.⁷ .................................................. H01R 9/26
[52] U.S. Cl. ............................................................ 439/716
[58] Field of Search .................................. 439/716, 709, 439/712, 714

[56] References Cited

U.S. PATENT DOCUMENTS

| | | | |
|---|---|---|---|
| 5,588,881 | 12/1996 | Eggert et al. | 439/709 |
| 5,615,079 | 3/1997 | Eggert et al. | 361/637 |
| 5,629,831 | 5/1997 | Eggert et al. | 361/624 |
| 5,741,142 | 4/1998 | Dux et al. | 439/76.1 |

FOREIGN PATENT DOCUMENTS 44 38 806 C1   3/1996   Germany .

Primary Examiner—Steven L. Stephan
Assistant Examiner—Amir Abdulmelik
Attorney, Agent, or Firm—Laubscher & Laubscher

[57] ABSTRACT

A locking device serves to lock an electronic module to a bank of terminal blocks, characterized by a body member having at least one pair of integral parallel spaced legs that extend downwardly within a corresponding T-shaped vertical groove contained in one end of a first one of the terminal blocks. The legs are resiliently biased apart and are provided at their free ends with hook or catch portions that extend laterally outwardly from opposite sides of the legs into corresponding locking recesses contained in opposite side walls of the groove, respectively, thereby to lock the body member with the bank of terminal blocks. The adjacent end of the body member contains a longitudinal chamber that slidably receives a locking member that is displaceable between retracted unlocked and extended locking positions relative to the body member. Accordingly, when the locking member is in the retracted position and a vertical locking tongue of T-shaped cross-sectional configuration integral with a side wall of the housing of the electronic module is inserted within the T-shaped groove of a second terminal block of the bank, the locking member may be displaced to its extended position above the locking tongue, thereby to fasten the module with the terminal block bank.

10 Claims, 4 Drawing Sheets

LOCKING MEANS FOR ELECTRONIC MODULES

BACKGROUND OF THE INVENTION

1. Field of the Invention

A locking device is provided for locking an electronic module to a bank of terminal blocks, characterized by the provision of a body member having at least one pair of integral parallel spaced legs that extend downwardly and are locked within a corresponding T-shaped vertical groove contained in one end of a first one of the terminal blocks, said body member containing at one end a chamber that slidably receives a locking member, whereby when a vertical tongue integral with a side wall of the module housing is inserted within the groove or vertical groove or slot contained in the end of an adjacent terminal block, the locking member may be displaced relative to the body member toward an extended locking position above the groove containing the tongue, thereby to retain the tongue within the groove and, consequently, to lock the electronic module to the bank of terminal blocks.

2. Brief Description of the Prior Art

As evidenced by the U.S. patents to Horn et al. U.S. Pat. No. 5,411,417, Eggert et al. U.S. Pat. No. 5,588,881 and Dux et al. U.S. Pat. No. 5,655,922, and the German patent No. DS 44 38 806 C1, it is well known in the patented prior art to removably connect an electronic module, such as an actuator, a sensor, or the like, with a bank of electrical terminal blocks, thereby to supply power to, or to electrically connect, electronic components and/or circuits contained within the module with the master system. Quite often the structural connection of the components is made by slidably inserting a T-shaped tongue that is integral with the module housing within corresponding T-shaped groove contained within the adjacent end of one of the terminal blocks, integral catch means being provided on the components which cooperate to lock the parts together. These known locking means present the drawback that after repeated and often rough usage, the cooperating catch parts become worn, thereby reducing the stability and reliability of the locking connection of the module with the bank of terminal blocks. Furthermore, even if the number of the catch means were to be increased to alleviate this problem of wear, the resulting increase of the locking force would be unacceptable since it would render separation of the components extremely difficult.

SUMMARY OF THE INVENTION

Accordingly, a primary object of the present invention is to provide an auxiliary or separate locking device for locking the connection of an electronic module with a bank of terminal blocks, thereby to improve in a reliable manner the mechanical connection between the components. As a consequence of the use of a separate locking device, the ease of handling of the components during the connection thereof is greatly simplified, and no complicated structural modification is required, since the fastening device cooperates with the conventional T-shaped grooves customarily provided in the adjacent ends of the terminal blocks of the bank. With the aid of the separate fastening device, a positive locking of the module to the terminal block bank is achieved that will withstand rough repeated connection and disconnection of the components.

A more specific object of the invention is to provide a locking device including a horizontal generally-rectangular body member having at least one pair of downwardly extending spaced locking legs that are resiliently biased apart and include at their free ends locking catches or hooks that extend outwardly from the remote sides thereof for engagement with corresponding locking recesses contained in the opposed walls of a T-shaped groove contained in an end portion of a first terminal block, thereby to lock the body member with the bank of terminal blocks. The adjacent end of the body member contains a chamber that slidably receives a locking member that is slidably displaceable from a retracted unlocked position toward an extended locking position above the end of a vertical groove contained in an adjacent terminal block, thereby to retain therein a vertical T-shaped tongue that is integral with an adjacent side wall of the module housing, whereby the module is locked to the terminal block bank.

According to a another object of the invention, in order to further lock the module with the terminal block bank, a second pair of downwardly extending spaced locking legs is provided at the other end of the body member for locked insertion within the groove contained in a third terminal block of the bank, and a second locking member is slidably displaceable to an extended locking position for retaining a second integral tongue on the housing within the vertical groove of an adjacent fourth terminal block of the bank.

According to another important object of the invention, the securing legs of the locking body member are designed to fit within the conventional T-shaped grooves or slots contained within the ends of the terminal blocks. It is particularly advantageous to provide two sets of locking legs adjacent the ends of the body member, respectively, together with two locking members that are slidably connected with opposite ends of the body member whereby when two spaced tongues on the module side wall are inserted within corresponding grooves contained in the terminal blocks, the two locking members may be displaced apart toward locking positions extending across the mouths of the grooves containing the tongues, thereby to greatly increase the resulting locking effect of the connection between the module and the terminal block bank. It is a simple manufacturing step to provide the locking recesses in the opposed walls of the T-shaped grooves contained in the ends of the terminal blocks.

BRIEF DESCRIPTION OF THE DRAWING

Other objects and advantages of the invention will become more apparent from a study of the following specification, when viewed in the light of the accompanying drawing, in which.

DETAILED DESCRIPTION

Figure 1A:
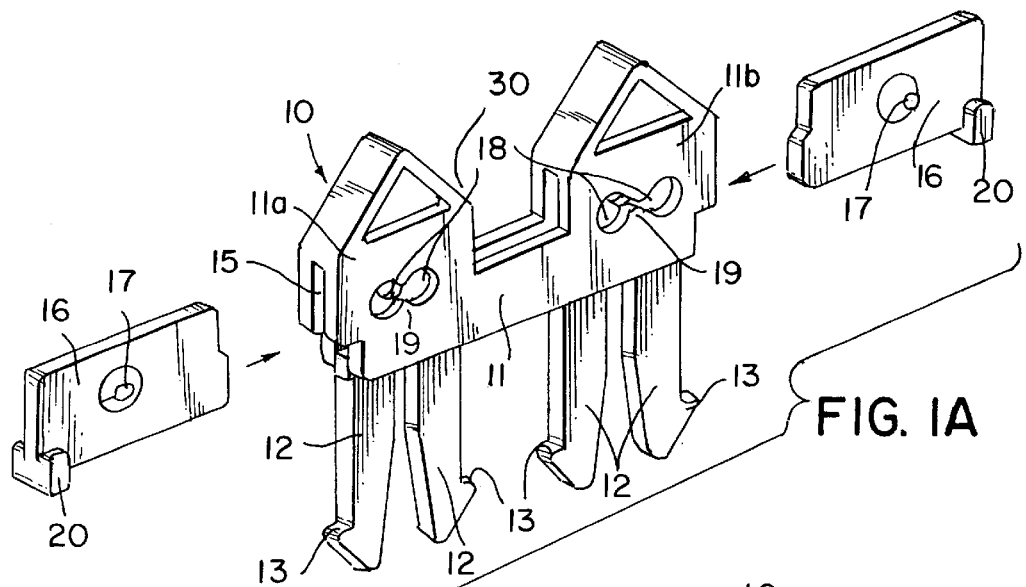
FIGS. 1A–1C are perspective views illustrating the locking device of the present invention in the exploded, partially assembled, and fully assembled positions, respectively.
Figure 1B:
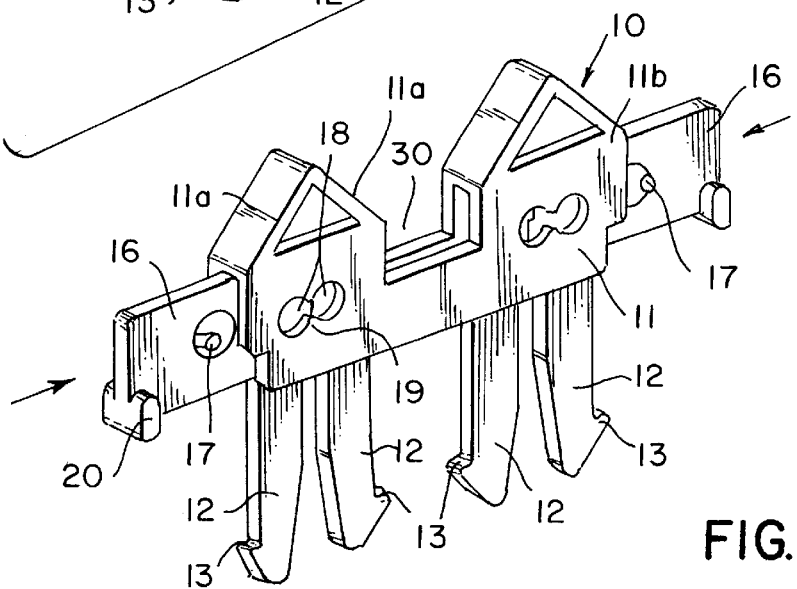
Figure 1C:
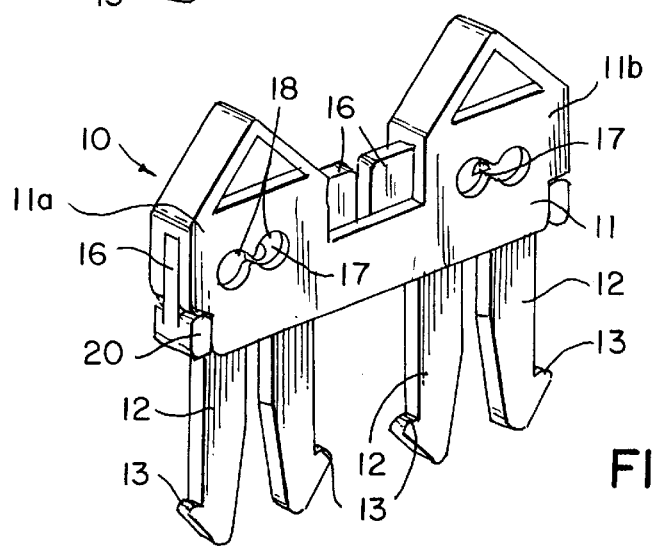

Referring first more particularly to FIG. 1A, the locking device 10 of the present invention includes a generally rectangular body member 11 having two pairs of generally downwardly extending integral legs 12. The legs of each pair are resiliently biased apart, and include on the remote surfaces of their outer extremities thereof hook-shaped catches or projections 13. The body member 11 contains a longitudinal through bore or channel 15, and the top portion of the body member contains a recess 30 that communicates with the guide channel 15 and defines a pair of upper body portions 11a and 11b, respectively. Slidably mounted in the guide channel 15 at each end of the body member 11 are a pair of locking elements 16, that are inserted within the ends of the guide channel 15, as indicated by the arrows. In order to retain the stop members in their retracted and extended positions, each locking member 16 is provided on its lateral surface with a catch projection 17 that cooperates with a pair of positioning openings 18 that are connected by narrow passage 19, respectively. Each locking member 16 is further provided with a stop portion 20 that cooperates with the end surfaces of the body member to restrict the extent of insertion of the locking elements 16 within the body member 11, when the locking devices are inserted from the partially assembled condition of FIG. 1B to the fully assembled retracted condition of FIG. 1C.

Figure 2:
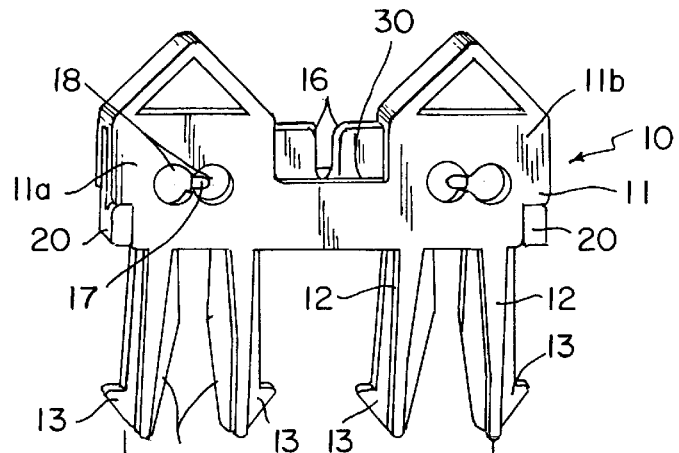
FIG. 2 is an exploded front view of the locking device, when in the retracted unlocked condition, prior to connection with a bank of terminal blocks.
Figure 2:
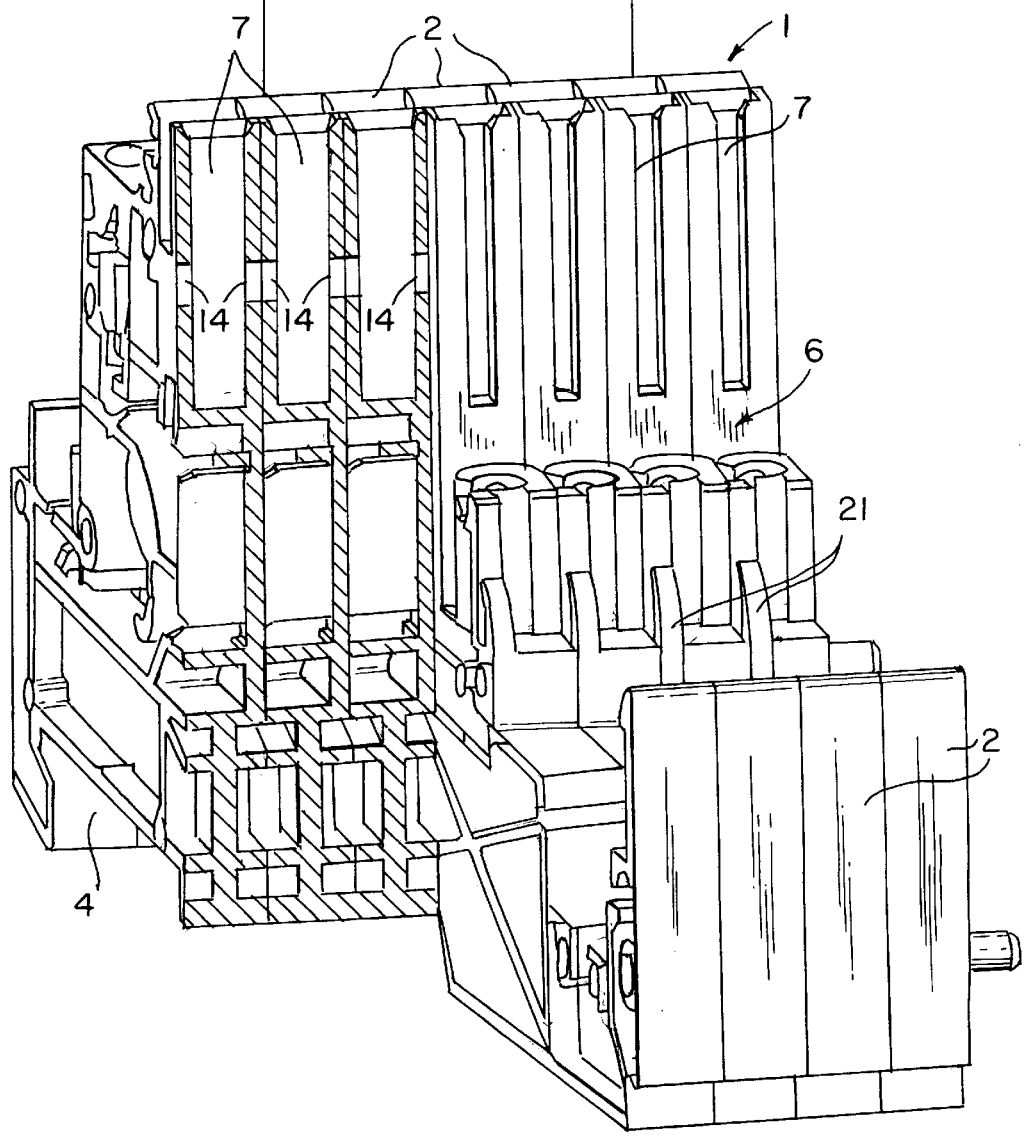

Referring now to FIG. 2, it will be seen that the locking device 10 is adapted to be displaced downwardly toward the bank of terminal blocks 1 so that the leg portions 12 will be introduced downwardly within corresponding slots 7 contained within associated ones of the terminal blocks 2, respectively. Each of the terminal blocks 2 is provided with a conventional catch 21 that engages a corresponding recess (not shown) contained in the module housing wall, and with locking feet 3 and 4 (FIG. 3) which cooperate with the flanges of the support rail R, as is known in the art.

Figure 3:
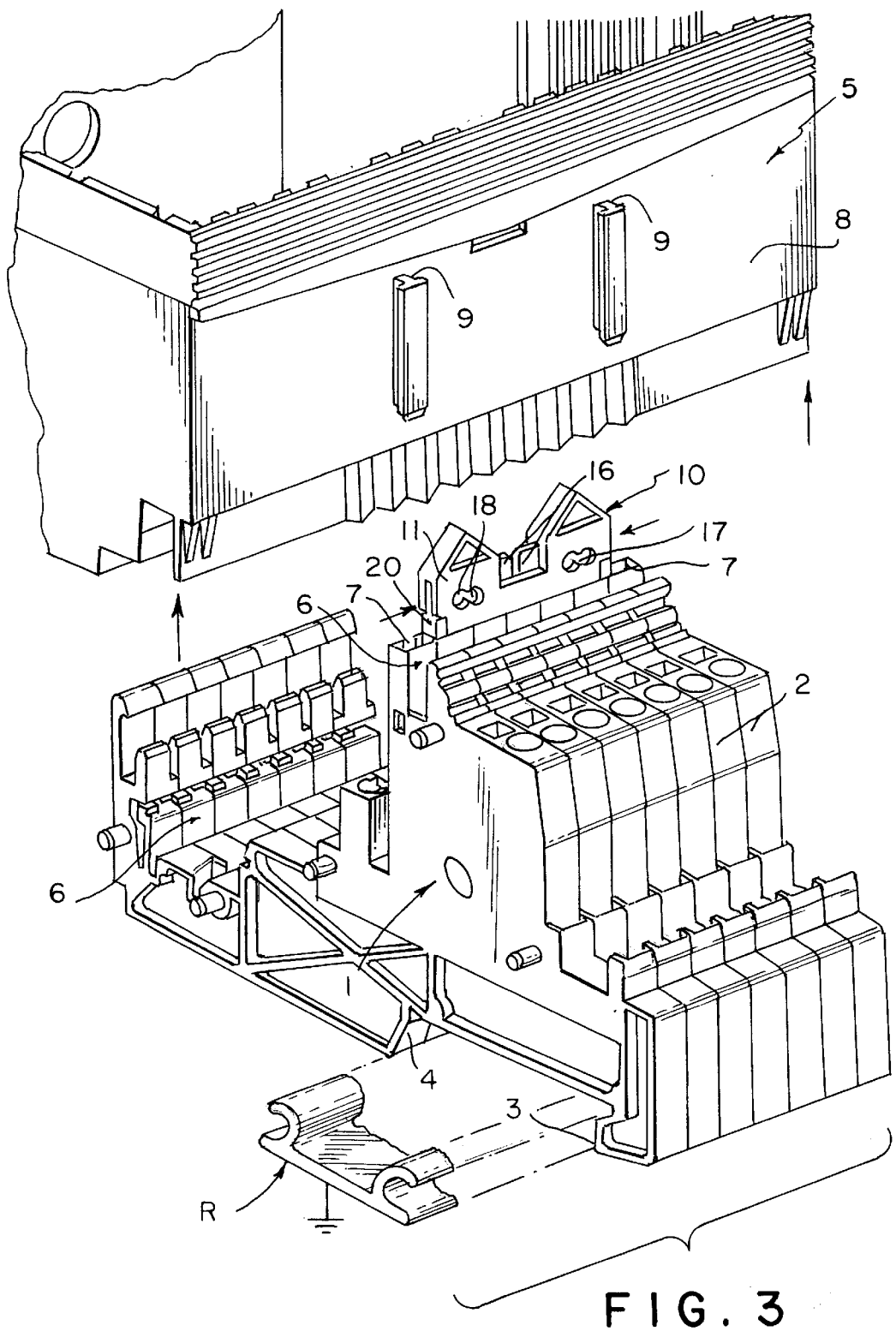
FIG. 3 is an exploded perspective front view illustrating the manner of connection of the integral locking tongues of the electronic module with the terminal block bank, the locking device being mounted in its retracted unlocked condition on the bank of terminal blocks.

Each of the slots 7 has a generally T-shaped cross-sectional configuration the opposed side walls of the grooves or slots 7 being provided with locking recesses 14 as best shown in FIG. 2. Thus, when the leg portions 12 are progressively introduced within the grooves 7, the leg portions 12 of each pair are biased apart to cause the locking hooks 13 to extend within corresponding recesses 14 contained in the opposed sidewalls of the grooves 7, respectively. The locking element 10 is thus fastened to the terminal block bank 1 with the locking members 16 being in their retracted unlocked positions, as shown in FIG. 3. The electronic module 5 includes a housing 8 having integral vertical spaced tongues 9 which are of a T-shaped cross-sectional configuration corresponding with the configuration of the T-shaped guide grooves 7, respectively. The spacing distance between the tongues 9 is at least as great as the length of the body member 11, whereby the tongues 9 may be introduced within the groves 7 of the adjacent terminal blocks on opposite sides of the body member 11, respectively.

Figure 4:
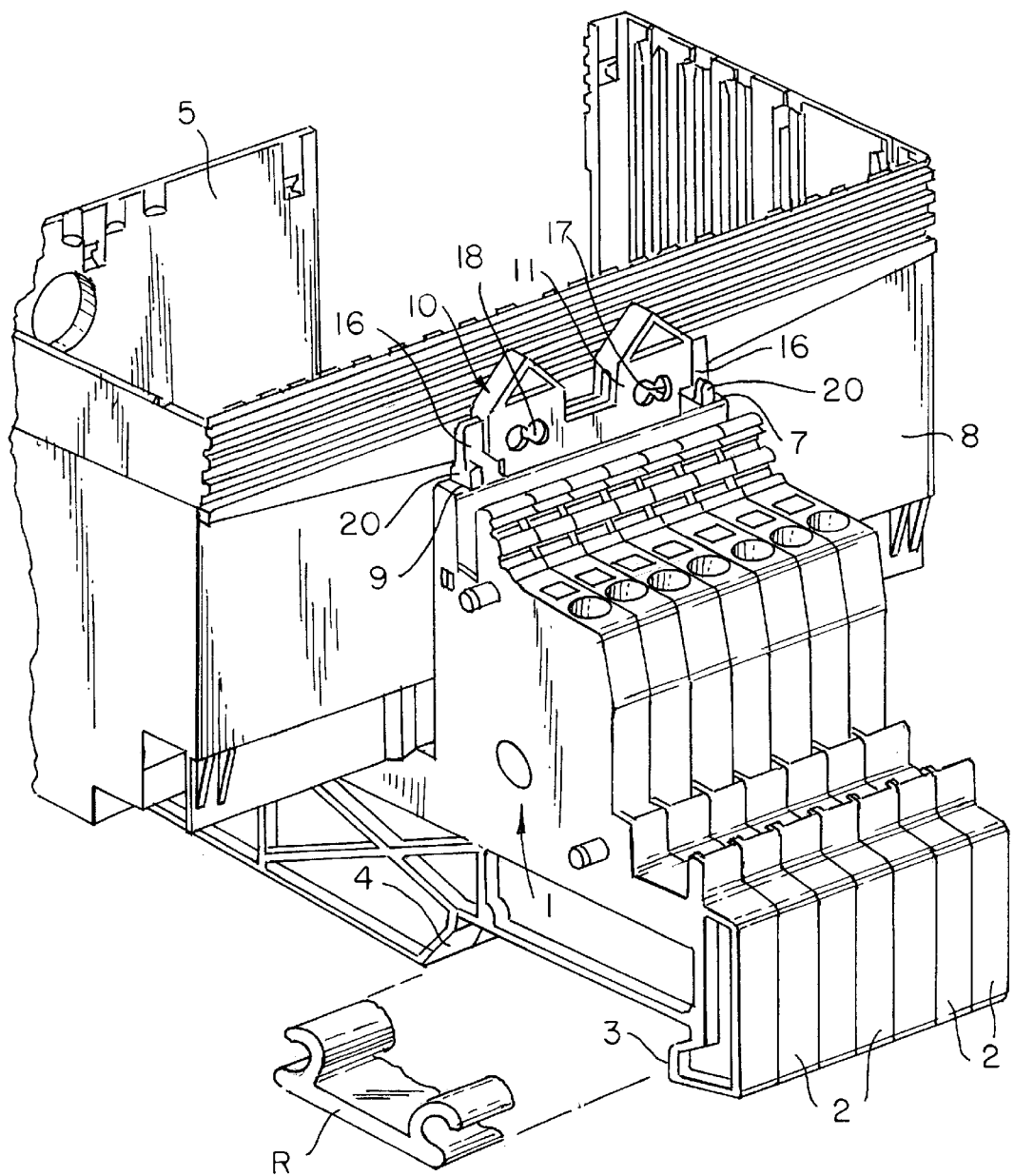
FIG. 4 is a front perspective view of the assembled components, wherein the locking device is in its extended locking condition to lock the module with the bank of terminal blocks.

Referring to FIG. 4, after the electronic module 5 has been assembled to the terminal block bank 1 with the fastening element 10 mounted thereon, the locking members 16 may be displaced apart toward locking positions in which the stop portions 20 extend above the grooves 7 that contain the tongue portions 9, respectively, thereby to lock the electronic module housing 8 to the terminal block blank 1.

It should be noted that in order to displace the locking members 16 outwardly apart from their retracted unlocked positions of FIG. 3 toward their extended locking positions of FIG. 4, the tip of a suitable operating tool such as a screwdriver may be inserted within the groove 30 and between the adjacent ends of the locking member 16, thereby to manually displace the locking members apart toward their extended locking positions.

As is known in the art, the remote end terminal blocks 2 of the bank 1 may serve as power supply and grounding terminal blocks, respectively. The locking device 10 has a relatively narrow width, and therefore, does not interfere with the space 6 defined in the upper end of the terminal block bank 1.

In order is disassemble the module from the terminal block bank 1, the locking members are displaced together from their extended locking positions of FIG. 4 toward their retracted unlocked positions of FIG. 3, whereupon the module 5 may be displaced upwardly relative to the terminal block bank 1 with the tongues 9 freely sliding upwardly in the corresponding guide grooves 7.

Owing to the provision of the separate locking device 10, the integral catch means 21 on the terminal blocks 2 that normally engage corresponding recesses on the module housing 8 may be eliminated, whereby the force required for connecting the electronic module to the bank of terminal blocks can be further reduced.

While in accordance with the provisions of the Patent Statutes, the preferred forms and embodiments of the invention have been illustrated and described, it will apparent to those skilled in the art that changes may be made without deviating from the inventive concept set forth above.

What is claimed is:

1. Fastening means (10) for locking the housing (8) of an electronic module (5) to a bank (1) of at least two stacked terminal blocks (2) each containing a T-shaped groove (7) for slidably receiving a corresponding T-shaped tongue (9) mounted on an adjacent wall of the housing, comprising:

(a) a body member (11) of generally rectangular cross-sectional configuration having top, bottom, side and end portions, said body member including:

(1) at least one pair of integral generally parallel spaced legs (12) that extend downwardly from said body member bottom portion, said legs being resiliently biased apart and having free end portions provided with catch hooks (13) that extend outwardly in opposite directions from the remote sides of said legs, respectively;

(2) one end portion of said body member containing a longitudinally extending guide chamber (15); and (b) a locking member (16) slidably mounted in said guide chamber for displacement in a direction generally normal to said catch legs between retracted unlocked and extended locked positions relative to said body member;

(c) said body member being operable to a mounted position on a first terminal block with said catch legs extending within the associated T-shaped slot of the first terminal block and with said catch hooks engaged in corresponding recesses (14) contained in the opposed side wall surfaces of the slot, whereby when said locking member is in its retracted position and the module housing is displaced relative to the terminal block to introduce the housing tongue within the T-shaped slot of a second one of said terminal blocks, said locking member may be displaced relative to said body member toward a locking position opposite the groove containing the tongue, thereby to lock the tongue within the groove, and the housing with the terminal block bank.

2. Fastening means as defined in claim 1, and further including retaining means (17,18) for retaining said locking member in said retracted unlocked and extended locked positions relative to said body member, respectively.

3. Fastening means as defined in claim 1, wherein said locking member includes stop means (20) for limiting the movement of said locking member in the direction of said retracted position, said stop means extending across the groove containing the tongue when the locking member is in the extended position.

4. Fastening means as defined in claim 1, wherein the top end of said body member is bifurcated to define a recess (30) that extends downwardly into communication with said guide chamber, thereby to define a pair of upper body portions (11a,11b) one of which is opposite said pair of catch legs, the length of said one body portion being less than that of said locking member, whereby a tool may be inserted into said groove to displace said locking member from its retracted position toward its extended position relative to said body member.

5. Fastener means as defined in claim 4, wherein said body member includes a second pair of said catch legs opposite the other of said upper body portions, a second guide chamber contained in the other end of said body member, and a second locking member slidably mounted in said second guide chamber for displacement between retracted unlocked and extended locked positions, respectively.

6. Fastening means for locking an electronic module (5) to a bank (1) of stacked terminal blocks (2), the electronic module including a housing (8) having a vertical side wall provided with a pair of spaced vertical tongues (9) each having a generally T-shaped cross-sectional configuration, each of the terminal blocks having an end portion adjacent said housing side wall containing a vertical groove (7) having a corresponding T-shaped cross-sectional configuration for slidably receiving one of said tongues, respectively, comprising:
 (a) a body member (11) of generally rectangular cross-sectional configuration having top, bottom, side and end portions, said body member having a length that is less than the spacing distance between the housing tongues and including:
  (1) two pairs of integral vertical horizontally-spaced legs (12) that extend downwardly from opposite ends of said body member bottom portion, respectively, the legs of each pair being resiliently biased apart and having free end portions provided with catch hooks (13) that extend outwardly in opposite directions from the remote sides of said catch legs, respectively;
  (2) each end portion of said body member containing a longitudinally extending guide chamber (15); and
 (b) a pair of locking members (16) slidably mounted in said guide chambers, respectively, for displacement in a direction generally normal to said legs between retracted unlocked and extended locked positions relative to said body member, respectively;
 (c) said body member being adapted for mounting on said terminal block bank with said pairs of catch legs extending within the T-shaped grooves of a corresponding first pair of said terminal blocks, respectively, the opposed wall surfaces of each groove containing locking recesses (14) receiving said catch hooks, respectively, thereby to lock said body member to said terminal block bank, whereby when said locking members are in their retracted positions and the electronic module is connected with the terminal block bank by the insertion of the housing tongues into the grooves contained in a second pair of terminal blocks on opposite sides of the first pair of terminal blocks, respectively, said locking members may be displaced apart toward their extended positions above the ends of the grooves containing said tongues, respectively, thereby to lock the electronic module with the terminal block bank.

7. Fastening means as defined in claim 6, and further including retaining means (17,18) for releasably retaining said locking members in their retracted and extended positions relative to said body member, respectively.

8. Fastening means as defined in claim 7, and further including stop means (20) for limiting the extent of displacement locking member in the direction of said retracted position, said stop means extending over the end of the groove containing a tongue when the associated lock member is in the extended locking position.

9. Fastening means for connecting an electronic module with a bank of terminal blocks, comprising:
 (a) an electronic module (5) including a housing (8) having a vertical side wall provided with a pair of vertical spaced tongues (9) each having a generally T-shaped cross-sectional configuration;
 (b) a plurality of corresponding terminal blocks (2) arranged in side-by-side relation to define a bank (1), each of said terminal blocks having an end portion containing a vertical groove (7) having a T-shaped cross-sectional configuration for slidably receiving one of said tongues, respectively; and
 (c) fastening means (10) for locking said electronic module to said terminal block bank, including:
  (1) a body member (11) of generally rectangular cross-sectional configuration having top, bottom, side and end portions, said body member having a length that is less than the spacing distance between said housing tongues and including:
   (a) two pairs of integral horizontally-spaced vertical legs (12) that extend downwardly from opposite ends of said body member bottom portion, respectively, the legs of each pair being resiliently biased apart and having free end portions provided with catch hooks (13) that extend outwardly in opposite directions from the remote sides of said legs, respectively;
   (b) each end portion of said body member containing a longitudinally extending guide chamber (15); and
  (2) a pair of locking members (16) slidably mounted in said guide chambers, respectively, for displacement in a direction generally normal to said legs between retracted unlocked and extended locked positions, respectively, relative to said body member;
 (d) said body member being mounted on said terminal block bank with said pairs of legs extending within the T-shaped grooves of a corresponding first pair of terminal blocks, respectively, the opposed wall surfaces of said grooves containing opposed locking recesses (14) for receiving said catch hooks, respectively, thereby to lock said body member to said terminal block bank, whereby when said locking members are in their retracted unlocked positions and said electronic module is connected with the terminal block blank by the insertion of said tongues into the grooves contained in a second pair of terminal blocks on opposite sides of said first pair of terminal blocks, respectively, said locking members may be displaced apart toward their extended positions relative to said body member to positions opposite the ends of said grooves containing said tongues, respectively, thereby to lock said electronic module to said bank of terminal blocks.

10. Fastening means as defined in claim 9, wherein the top portion of said body member is bifurcated to define a pair of upper body portions (11*a*, 11*b*) containing said guide chambers, respectively, the lengths of said locking members being greater than the corresponding longitudinal dimensions of said upper body portions, respectively, whereby when said locking members are in their retracted positions, said locking members can be displaced apart toward their extended locked positions by a tool that is inserted into said groove and between the adjacent ends of said locking members.

* * * * *